US008896127B2

(12) United States Patent
Chang et al.

(10) Patent No.: US 8,896,127 B2
(45) Date of Patent: Nov. 25, 2014

(54) VIA STRUCTURE AND VIA ETCHING PROCESS OF FORMING THE SAME

(71) Applicant: Taiwan Semiconductor Manufacturing Company, Ltd., Hsinchu (TW)

(72) Inventors: Hung-Pin Chang, Taipei County (TW); Wen-Chih Chiou, Toufen (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 98 days.

(21) Appl. No.: 13/671,711

(22) Filed: Nov. 8, 2012

(65) Prior Publication Data

US 2013/0062767 A1     Mar. 14, 2013

Related U.S. Application Data

(62) Division of application No. 12/722,949, filed on Mar. 12, 2010, now Pat. No. 8,329,578.

(60) Provisional application No. 61/164,069, filed on Mar. 27, 2009.

(51) Int. Cl.
*H01L 23/48* (2006.01)
*H01L 23/52* (2006.01)
*H01L 29/40* (2006.01)
*H01L 21/768* (2006.01)

(52) U.S. Cl.
CPC ....... *H01L 21/76898* (2013.01); *Y10S 438/978* (2013.01)
USPC ............... 257/774; 257/E21.578; 257/751; 257/773; 438/640; 438/701; 438/713; 438/978

(58) Field of Classification Search
CPC ............... H01L 23/5226; H01L 2924/01078; H01L 2924/01079
USPC ............... 257/E21.578, E21.585, E23.011, 257/E23.067, 741, 751, 762, 773, 774; 438/629, 637, 639, 640, 666–668, 672, 438/675, 701, 713, 978
See application file for complete search history.

(56) References Cited

U.S. PATENT DOCUMENTS 4,363,830 A * 12/1982 Hsu et al. .............. 438/586
5,229,647 A * 7/1993 Gnadinger ............. 257/785
(Continued)

FOREIGN PATENT DOCUMENTS

JP     2007266519     10/2007
JP     2009539267     11/2009
(Continued)

OTHER PUBLICATIONS

JP OA dated Oct. 22, 2013 from corresponding application No. JP 2013-14032.
(Continued)

*Primary Examiner* — Chris Chu
(74) *Attorney, Agent, or Firm* — Lowe Hauptman & Ham, LLP

(57) ABSTRACT

An integrated circuit structure includes a semiconductor substrate and a hard mask layer formed on the semiconductor substrate. The integrated circuit structure further includes at least a conductive layer formed in the hard mask layer and a via extending from the hard mask layer to at least a portion of the semiconductor substrate, wherein the via has a round corner and a tapered sidewall.

20 Claims, 7 Drawing Sheets

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,110,825 A * | 8/2000 | Mastromatteo et al. | 438/667 |
| 6,184,060 B1 | 2/2001 | Siniaguine | |
| 6,322,903 B1 | 11/2001 | Siniaguine et al. | |
| 6,346,457 B1 * | 2/2002 | Kawano | 438/424 |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,828,175 B2 * | 12/2004 | Wood et al. | 438/113 |
| 6,841,883 B1 | 1/2005 | Farnworth et al. | |
| 6,882,030 B2 | 4/2005 | Siniaguine | |
| 6,888,253 B1 * | 5/2005 | Rogers et al. | 257/774 |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,012,658 B2 * | 3/2006 | Sawasaki et al. | 349/43 |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,393,779 B2 | 7/2008 | Furukawa et al. | |
| 7,410,897 B2 * | 8/2008 | Kanzawa | 438/637 |
| 7,473,582 B2 * | 1/2009 | Wood et al. | 438/113 |
| 7,521,360 B2 * | 4/2009 | Halahan et al. | 438/678 |
| 7,528,053 B2 * | 5/2009 | Huang et al. | 438/458 |
| 7,833,894 B2 * | 11/2010 | Hiatt | 438/598 |
| 7,880,307 B2 * | 2/2011 | Farnworth et al. | 257/774 |
| 7,973,413 B2 * | 7/2011 | Kuo et al. | 257/774 |
| 8,183,160 B2 | 5/2012 | Lagha et al. | |
| 8,610,259 B2 * | 12/2013 | Oganesian et al. | 257/692 |
| 8,637,968 B2 * | 1/2014 | Haba et al. | 257/686 |
| 2006/0046495 A1 * | 3/2006 | Frohberg et al. | 438/706 |
| 2010/0032808 A1 | 2/2010 | Ding et al. | |

FOREIGN PATENT DOCUMENTS

| | | |
|---|---|---|
| TW | 375797 | 12/1999 |
| TW | 200408002 | 5/2004 |
| TW | 200601460 | 1/2006 |
| TW | 200735264 | 9/2007 |
| WO | WO 2005/043622 | 5/2005 |

OTHER PUBLICATIONS

Appeal No. FUFUKU2013-14032; Patent Application No. 2010-71426; Drafting Date, Oct. 16, 2013.

Office Action dated Mar. 18, 2013 from corresponding application No. JP 2010-071426.

JP OA dated Feb. 28, 2014 from corresponding application No. JP 2013-14032.

Decision of Refusal dated Apr. 9, 2013 from corresponding application No. JP 2010-071426.

Office Action dated Jul. 8, 2013 from corresponding application No. TW 099109037.

* cited by examiner

VIA STRUCTURE AND VIA ETCHING PROCESS OF FORMING THE SAME

CROSS-REFERENCE TO RELATED APPLICATIONS

The present application is a divisional of U.S. application Ser. No. 12/722,949, filed Mar. 12, 2010, which claims the priority of U.S. Provisional Application No. 61/164,069, filed on Mar. 27, 2009, which are incorporated herein by reference in their entireties.

TECHNICAL FIELD

The present disclosure relates to the fabrication of semiconductor devices, and more particularly, to a via structure and a via etching process of forming the same.

BACKGROUND

Generally, the speed at which an integrated circuit operates is influenced by the distance between the farthest separated components that communicate with each other on the chip. Laying out circuits as three-dimensional structures has been shown to significantly reduce the communication path length between on-chip components, provided the vertical distances between the layers are much smaller than the chip width of the individual layers. Thus, by stacking circuit layers vertically, the overall chip speed is typically increased. One method that has been used to implement such stacking is through wafer bonding. Wafer bonding is the joining together of two or more semiconductor wafers on which integrated circuitry has been formed. Wafers are typically joined by direct bonding of external oxide layers or by adding adhesives to inter-level dielectric (ILD) layers. The bonded result produces a three-dimensional wafer stack that is subsequently diced into separate "stacked die," with each individual stacked die having multiple layers of integrated circuitry. In addition to the increased speed that the three-dimensional circuitry typically experiences, wafer stacking offers other potential benefits, including improved form factors, lower costs, and greater integration through system on chip solutions. In order to enable the various components integrated within each stacked die, electrical connections are provided that provide conductors between vertical layers.

Vias have been routinely used in semiconductor fabrication to provide electrical coupling between one or more layers of conductive material within a semiconductor device. More recently, through-silicon vias (TSVs) have arisen as a method of overcoming limitations of conventional wire bonding for example, as increases in performance and density requirements no longer allow traditional wire bonding to be adequate. TSVs allow for shorter interconnects by forming an interconnect in the z-axis. The interconnect is created through a substrate (e.g. wafer), by forming a via extending from a front surface to a back surface of the substrate. TSVs are also useful in forming interconnects for stacked wafers, stacked die, and/or combinations thereof.

The use of TSVs technology however creates challenges. The aspect ratio of the via may be quite high (e.g. the thickness of the substrate or the depth of the via is large as compared to the diameter of the via). Conventional methods of forming a via may lead to an undesirable undercut in layers (e.g. undercuts between dielectric hard mask and silicon) of the substrate. In one approach for eliminating the silicon undercut profile, a sacrificial polymer is formed on the vertical surfaces of the hard mask opening to protect a dielectric hard mask from lateral etching in subsequent via etching process. Such a pre-treatment leads to a new set of problems and issues associated with via filling process. For example, issues include a silicon birds beak profile existed at the silicon edge and a roughness sidewall (e.g., a scalloping pattern on the top of the via sidewall), which cause poor sidewall coverage, improper formation in depositing a seed layer, a barrier layer and/or a passivation layer processes, and become an obstacle to accelerating the via filling process. The sidewall scalloping roughness also has an impact on TSV electrical performance.

Accordingly, there is a need for an improved via and a method of fabricating such to avoid the shortcomings of the conventional process.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

Figure 1:
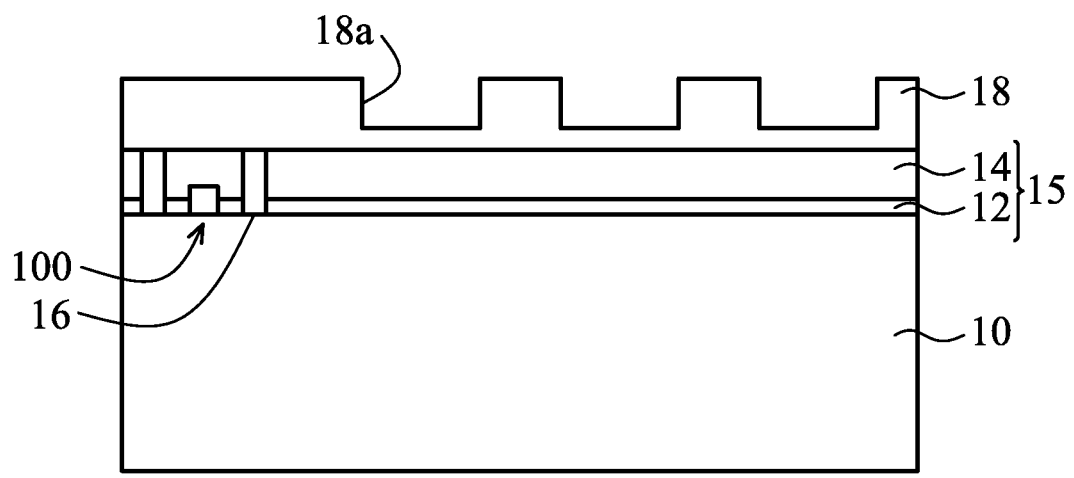
FIGS. 1 to 6 are cross-sectional diagrams illustrating an exemplary embodiment of a via etching process.

The present disclosure relates generally to a via etching process, which can be applied to any process for forming an opening profile in a semiconductor substrate. More particularly, the present disclosure relates to a via structure and a via etching process of fabricating the same, which can be applied to a through-substrate via process (e.g., through-silicon via or through-wafer via process) for forming a vertical interconnection on the stacked wafers/dies. The via etching process may be formed after the formation of the front-end-of-the line (FEOL) devices and before the interconnect structure. The via etching process may be formed after the formation of the FEOL devices and the interconnect structure. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, adjacent, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including, for example, etching a substrate, may include embodiments where features are formed above the surface of the substrate, directly on the surface of the substrate, and/or extending below the surface of the substrate (such as, vias). A substrate may include a semiconductor wafer and one or more layers formed on the wafer. A via, as defined herein, may provide a connection between one or more conductive layers (e.g., metal interconnect layers, contact pads including bonding pads) on the substrate, between a conductive layer (e.g., metal interconnect layer) and a semiconductor layer (such as a silicon feature), and/or other desired connections between features formed on or coupled to a substrate. The connection provided by a via may or may not provide an electrical pathway from one feature to another feature. A via may be filled with conductive material, insulating material, and/or other materials used in the art. Furthermore a via may be formed on the substrate including an opening in one or more layers on the substrate, including dielectric layers, metal layers, semiconductor layers, and/or other features known in the art.

Herein, cross-sectional diagrams of FIGS. 1 to 6 illustrate an exemplary embodiment of a via etching process. The processes described in FIGS. 1 to 6 proceed in accordance with the steps set forth in the flow chart of FIG. 7.

The method begins at step 200 where a semiconductor substrate 10 is provided. With reference now to FIG. 1, there is shown a cross-sectional diagram of a semiconductor substrate 10, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like. The figure illustrates a device 100 processed from the semiconductor substrate 10. For example, the device 100 is a transistor including a gate and source/drain regions. A contact etch stop layer 12 and an inter-layer dielectric (ILD) layer 14 are deposited on the substrate 10, which form a hard mask layer 15 for the formation of a through silicon via as described below. The hard mask layer may include an oxide (such as silicon oxide), a nitride (such as silicon nitride $S_3N_4$), silicon carbide, silicon oxynitride, and/or other suitable dielectric materials. The hard mask layer formed by chemical vapor deposition (CVD), physical vapor deposition (PVD), atomic layer deposition (ALD), and/or other processes. One example of the contact etch stop layer 12 is a silicon nitride layer, and one example of the ILD layer 14 is a phosphosilicate glass (PSG) layer. A contact structure 16 is formed in a contact opening penetrating the contact etch stop layer 12 and the ILD layer 14 to provide electrical contact to the device 100. A layer of conducting material filling the contact may comprise various materials, such as copper, tungsten, aluminum, titanium, tataniumpolysilicon, and the like. The excess portions of conducting material on the ILD layer 14 are removed either through etching, chemical mechanical polishing (CMP), or the like.

Figure 2:
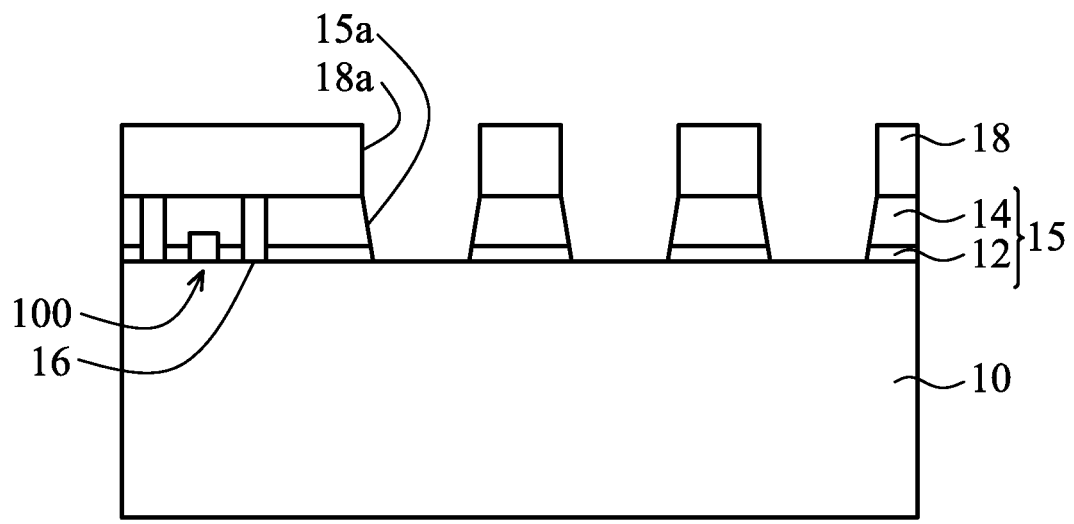

The method then proceeds to step 210, where a photoresist layer 18 is spin coated on the hard mask layer 15. The photoresist layer 18 is then patterned by exposure, bake, developing, and/or other photolithographic processes to provide an opening 18a in the photoresist layer 18 exposing the hard mask layer 15. As illustrated in FIG. 2, the method then proceeds to step 220 where the exposed hard mask layer 15 is then etched, by a wet etch or dry etch process, using the patterned photoresist layer 18 as a masking element to provide an opening 15a. In an embodiment, the hard mask layer opening is etched using a reactive ion etch (RIE). The photoresist layer 18 and the hard mask layer 15, including their respective openings 18a and 15a, form an etching mask for the formation of a through-silicon via as described below.

Figure 3:
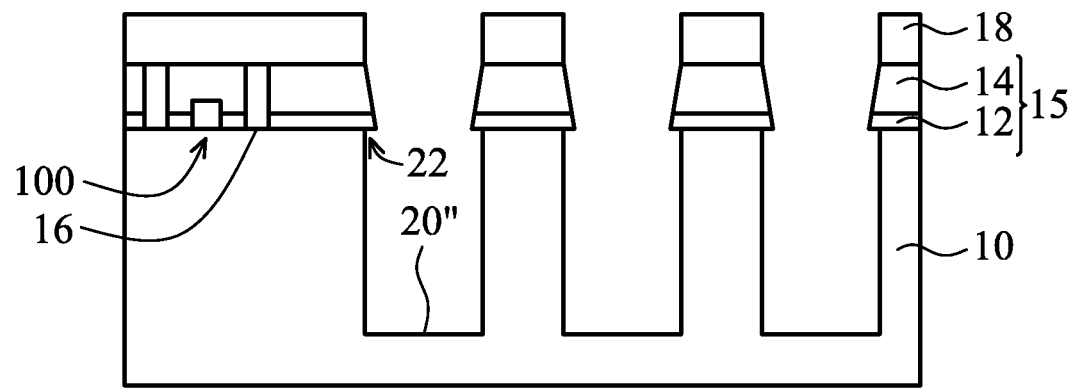

With reference to FIG. 3, the method proceeds to step 230 where a via 20 is etched in the semiconductor substrate 10. The via 20 (e.g., an opening, an aperture) is etched using the hard mask layer 15 and the photoresist layer 18 as masking elements, forming a through-substrate via 20 passing through at least a portion of the semiconductor substrate 10. The through-substrate via 20 may be etched using any suitable etching method including, for example, a plasma etch, a chemical wet etch, a laser drill, and/or other processes. In an embodiment, the etching process includes a deep RIE process to etch the semiconductor substrate 10. The etching process may be such that a via is etched from the front surface (e.g., circuit side) to the back surface (e.g., non-circuit side) of the semiconductor substrate. In an embodiment, the via may be approximately tens of micrometers (μm) to hundreds of μm in depth. The etching process may result in a through-substrate via having a vertical sidewall profile or a tapered sidewall profile.

Figure 4:
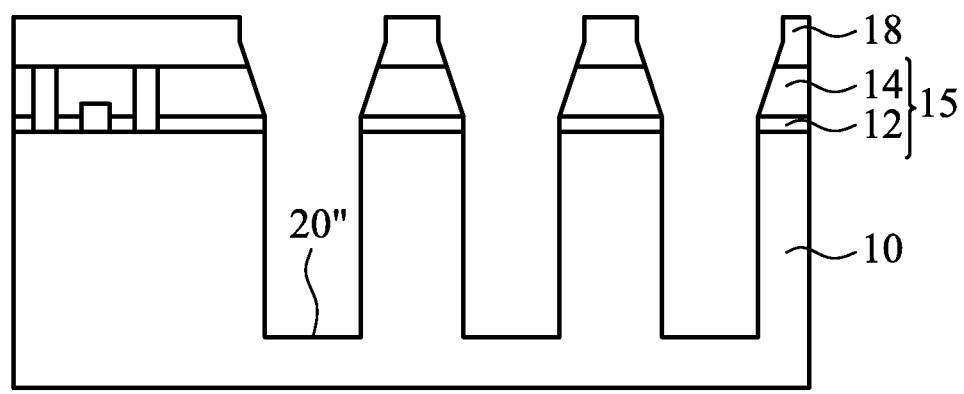
Figure 5:
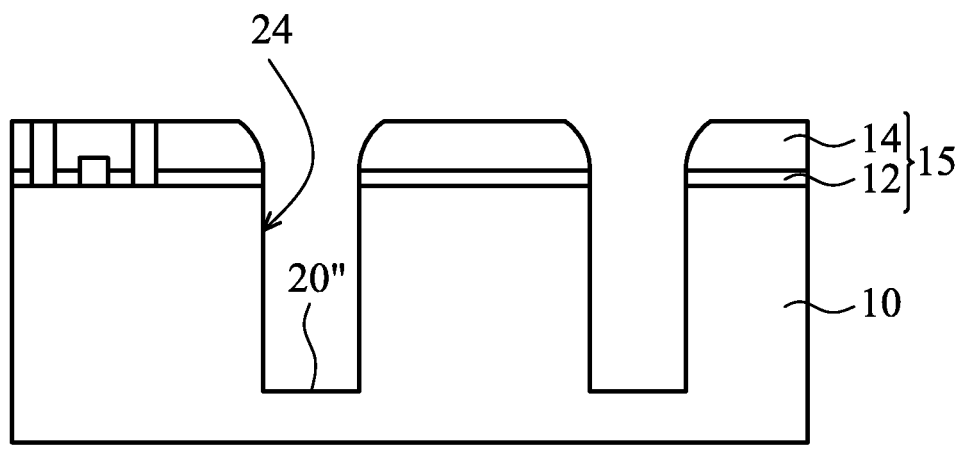

In order to eliminate a silicon undercut 22 formed at the top corner of the through-substrate via 20 during the via etching process, step 240 of an undercut trimming process is performed to round the via corners and smooth the via sidewall roughness, thus eliminating a scalloping pattern on the via sidewall. This trimming process also creates a through-substrate via 20" with a tapered sidewall profile as shown in FIG. 4. The trimming process may use any suitable etching method including, for example, a plasma dry etch, a chemical wet etch, or other processes. For example, the trimming process is performed in a dry etching device, using a mixed gas of He, Ar, $O_2$, CF based gases, $NF_3$ and $SF_6$ under the conditions of a gas pressure of 5-50 mTorr and an RF bias power of 1000-2500 W. After the trimming process is completed, at step 250 of photoresist ash process, the photoresist layer 18 is stripped from the semiconductor substrate 10, and the via 20" has a rounded corner 24 as shown in FIG. 5. It may be optional to further clean any remaining residues that may exist on the substrate 10 using a wet cleaning process, involving either an acidic or basic solution.

The undercut trimming process performed after the via etching process can eliminate the silicon undercut profile, silicon bird's beak structure and scalloping pattern so as to smooth the via sidewall profile, round the top corner of the via, and improve the via sidewall coverage for subsequent depositing processes, including the formation of a seed layer, a barrier layer and/or a passivation layer. This can benefit the via filling process and enhance the through-substrate via performance.

Figure 6:
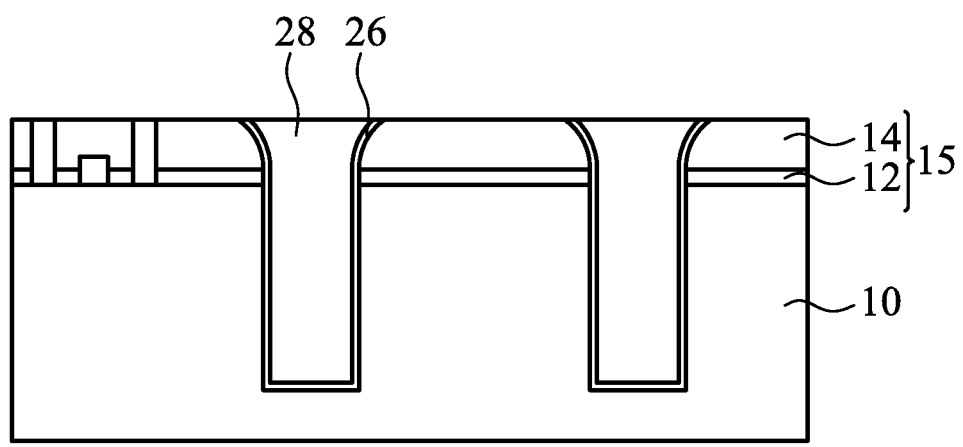
Figure 7:
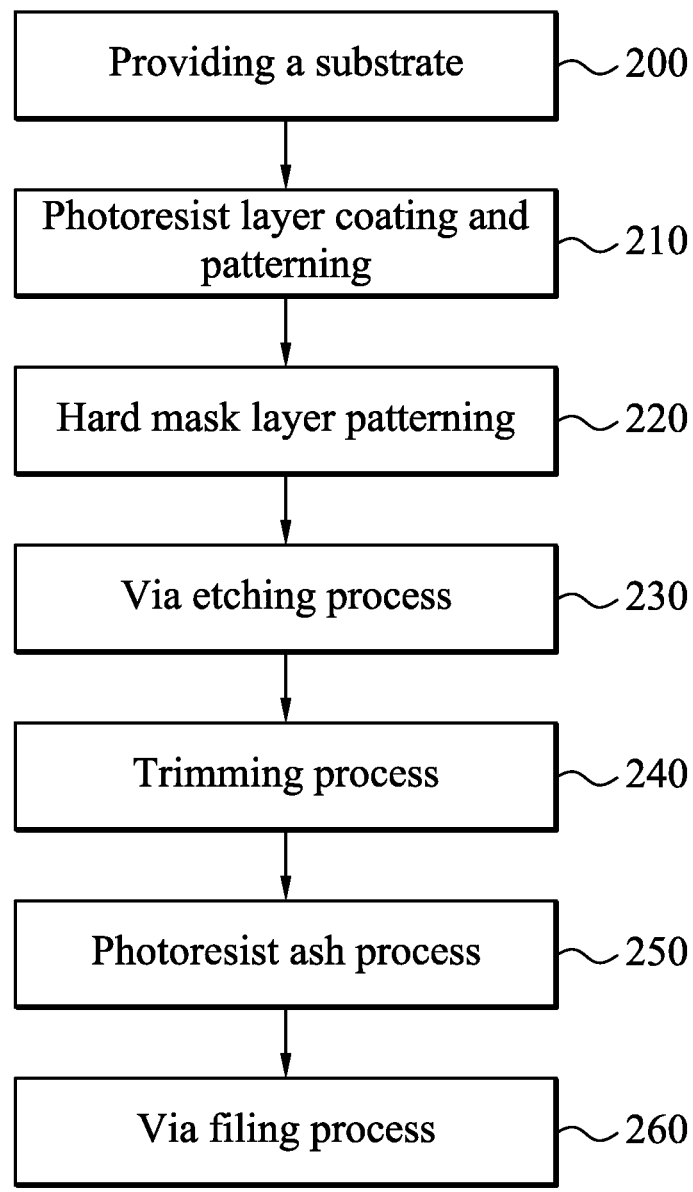
FIG. 7 is a flow chart of an exemplary embodiment of a via etching process.

As shown in FIG. 6, the method proceeds to step 260 where the through-substrate via 20" having a tapered profile and a rounded corner is then coated and/or filled with an insulating material 26 and/or a conductive material 28. The insulating material 26 may include silicon dioxide ($SiO_2$), silicon nitride ($Si_3N_4$), and/or other suitable dielectric materials. The insulating material may provide isolation of the conductive material formed in the via from one or more features. The insulating layer may be grown, such as by thermal oxidation, or deposited, such as by CVD. The via may then be filled with the conducting material 28 such that it is operable to provide electrical coupling to one or more interconnects which provide coupling to one or more other device features on the substrate. In an embodiment, a seed layer may first be formed, such as a seed layer including copper. In an embodiment, one or more adhesion promotion layers may be formed. In an embodiment, a diffusion barrier layer may be formed in the via 20 such as, a layer including TaN. The via may be filled with conducting material such as, copper, aluminum, tungsten, tantalum, titanium, nickel, cobalt, one or more metal silicides, one or more metal nitrides, polysilicon, and/or other suitable materials. In an embodiment, the via is filled with conducting material using a plating process. Other examples of methods for filling the via include sputtering or PVD, CVD processes, and/or other deposition processes. The method may continue to further process steps such as chemical mechanical polish, wafer thinning, further metallization processes to provide interconnections, and/or other processes.

Cross-sectional diagrams of FIG. 8 to FIG. 13 illustrate another exemplary embodiment of a via etching process. The processes described in FIGS. 8 to 13 proceed in accordance with the steps set forth in the flow chart of FIG. 7. Explanation of the same or similar portions to the description in FIGS. 1 to 6 is omitted herein.

Figure 8:
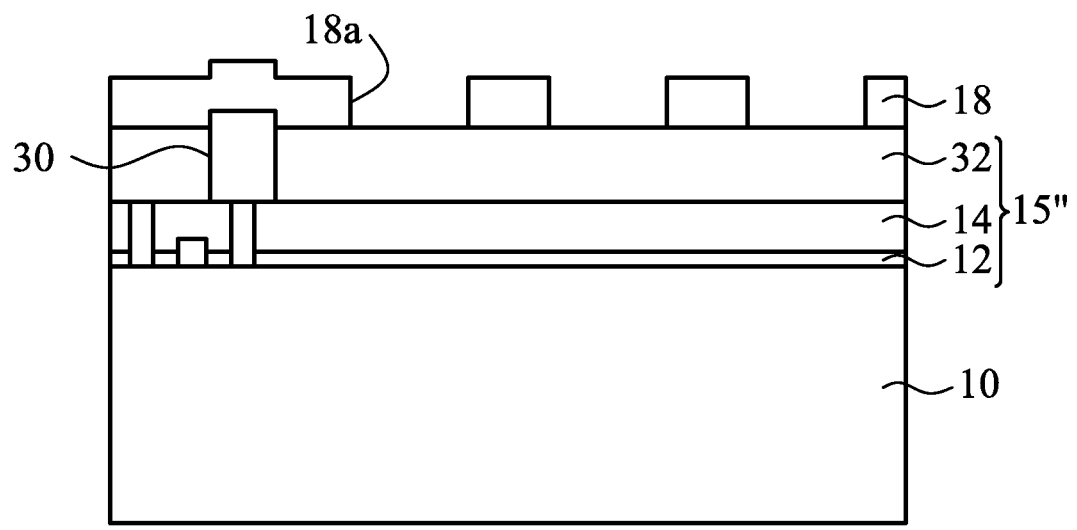
FIGS. 8 to 13 are cross-sectional diagrams illustrating another exemplary embodiment of a via etching process.

The method begins at step 200 of providing a substrate with front-end of the line (FEOL) features and back-end of the line (BEOL) features. Referring to FIG. 8, illustrated is a semiconductor substrate 10 including an interconnect structure 30 (e.g., interconnect layers) formed including a plurality of metal layers, a plurality of contact vias coupling metal layers, and inter-metal dielectric (IMD) layers 32 separating the metallization. The semiconductor substrate 10 further comprises one or more front-end of the line (FEOL) features, which may include, for example, gate structures, source/drain regions, other doped regions, isolation structures, contacts to one or more of the gate, source, or drain regions, memory elements (e.g., memory cells), and/or other features. Typically, these FEOL features are formed on the front surface of the semiconductor substrate 10. One or more of the FEOL features are electrically coupled to the interconnect structure 30. The interconnect structure 30 may be referred to as a back-end of the line (BEOL) feature. It should be also understood that "front" and "back" such as the front surface of the substrate and the back surface of the substrate, as used herein are arbitrary and the surfaces of the substrate may be referenced by any suitable convention.

The interconnect structure 30 includes four metal layers. However any number of metal layers is possible. In the interconnect structure 30, the metal layers and vias may include conductive material such as, copper, aluminum, tungsten, tantalum, titanium, nickel, cobalt, one or more metal silicides, one or more metal nitrides, polysilicon, gold, silver, and/or other conductive materials, possibly including one or more refractory layers or linings. The metal layers and/or vias may be formed using processes such as, CVD, PVD, ALD, plating, and/or other processes.

The IMD layer 32 and the underlying dielectric layers 12 and 14 form a hard mask layer 15" for the formation of a through silicon via as described below. The IMD layer 32 comprises a low dielectric constant. The IMD layer 32 may provide for minimized capacitive coupling between the metal traces (e.g., interconnect lines) in the interconnect structure 30. The IMD layer 32 may provide isolation for metal layers. Examples of other materials that may be suitable as the IMD layer 32 include tetraethylorthosilicate (TEOS) oxide, undoped silicon glass, or doped silicon oxide such as borophosphosilicate glass (BPSG), fused silica glass (FSG), phosphosilicate glass (PSG), boron doped silicon glass (BSG), SILK™ (a product of Dow Chemical of Michigan), BLACK DIAMOND® (a product of Applied Materials of Santa Clara, Calif.), and/or other insulating materials known in the art. The IMD layer 32 may be formed by processes such as chemical vapor deposition (CVD), atomic layer deposition (ALD), physical vapor deposition (PVD), spin-on coating, and/or other processes.

Figure 9:
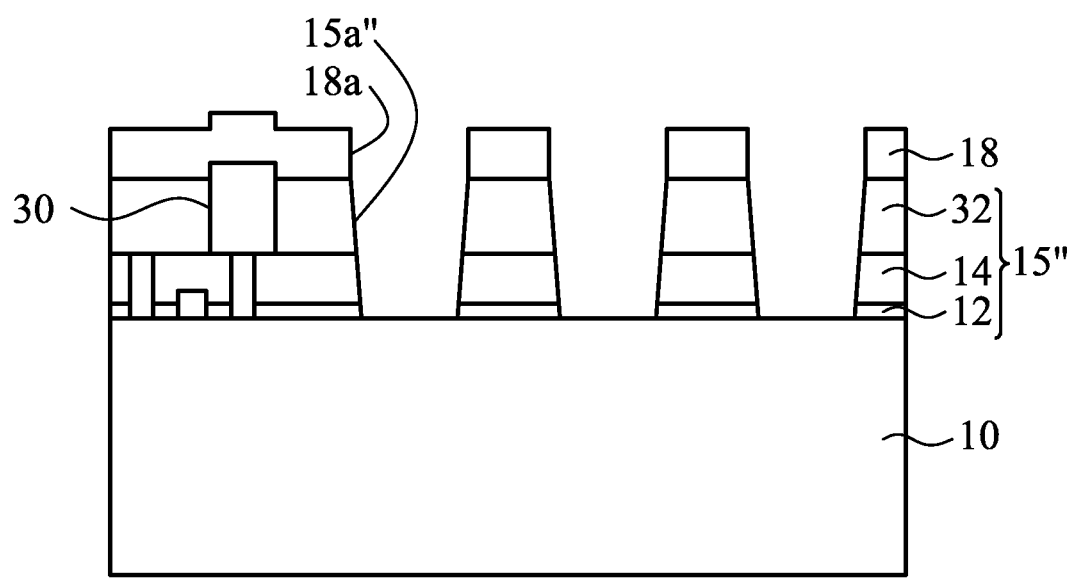

The method then proceeds to step 210 where a photoresist layer 18 is spin coated on the hard mask layer 15". The photoresist layer 18 is then patterned by exposure, bake, developing, and/or other photolithographic processes to provide an opening 18a in the photoresist layer 18 exposing the hard mask layer 15". As illustrated in FIG. 9, the method then proceeds to step 220 where the exposed hard mask layer 15" is then etched, by a wet etch or dry etch process, using the patterned photoresist layer 18 as a masking element to provide an opening 15"a. The photoresist layer 18 and the hard mask layer 15", including their respective openings 18a and 15"a, form an etching mask for the formation of a through-silicon via as described below.

Figure 10:
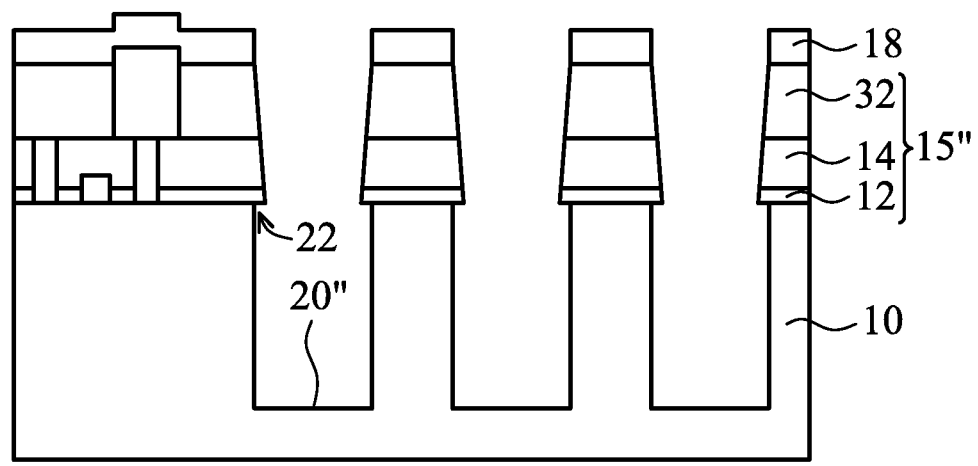
Figure 11:
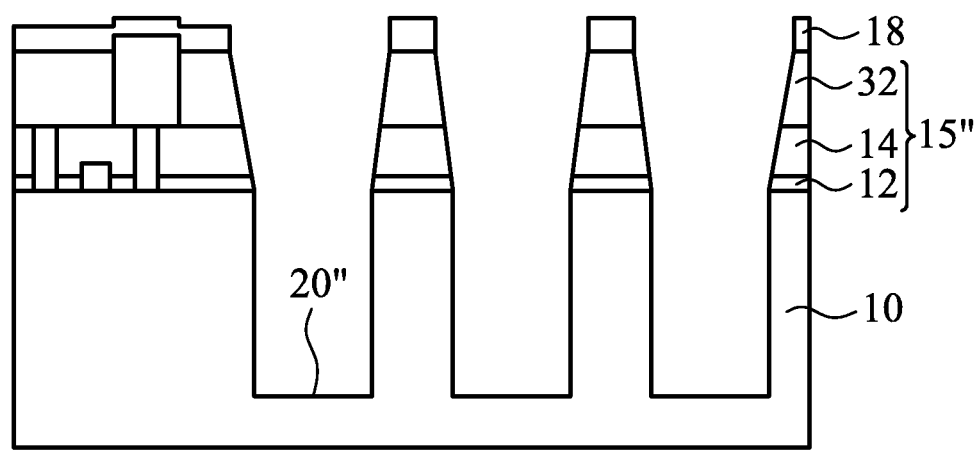

With reference to FIG. 10, the method proceeds to step 230 where a via 20 is etched in the semiconductor substrate 10. The via 20 (e.g., an opening, an aperture) is etched using the hard mask layer 15" and the photoresist layer 18 as masking elements, forming a through-substrate via 20 passing through at least a portion of the semiconductor substrate 10. The through-substrate via 20 may be etched using any suitable etching method including, for example, a plasma etch, a chemical wet etch, a laser drill, and/or other processes. In an embodiment, the etching process includes a deep reactive ion etching (RIE) process to etch the semiconductor substrate 10. The etching process may be such that a via is etched from the front surface (e.g., circuit side) to the back surface (e.g., non-circuit side) of the semiconductor substrate. In an embodiment, the via may be approximately tens of μm to hundreds of μm in depth. The etching process may result in a through-substrate via having a vertical sidewall profile or a tapered sidewall profile.

Figure 12:
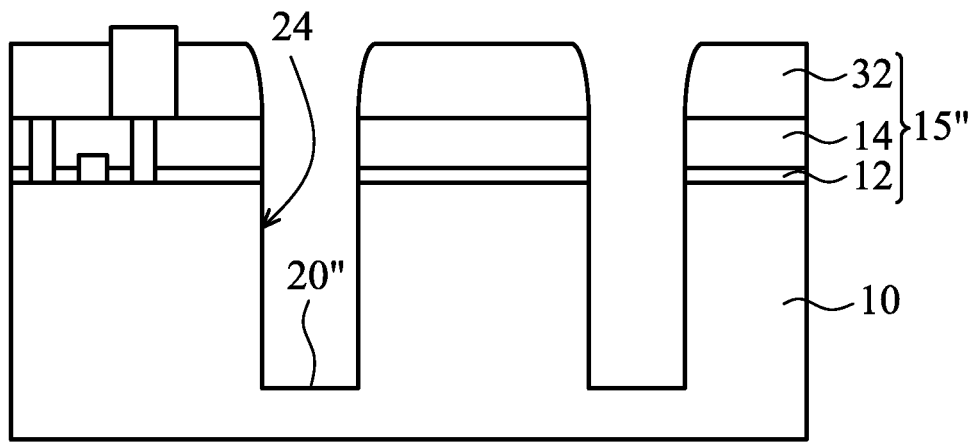

In order to eliminate a silicon undercut 22 formed at the top corner of the through-substrate via 20 during the via etching process, step 240 of an undercut trimming process is performed to round the via corner and smooth the via sidewall roughness, thus eliminating a scalloping pattern on the via sidewall. This trimming process also creates a through-substrate via 20" with a tapered sidewall profile. The trimming process may use any suitable etching method including, for example, a plasma dry etch, a chemical wet etch, or other processes. For example, the trimming process is performed in a dry etching device, using a mixed gas of He, Ar, $O_2$, CF based gases, $NF_3$ and $SF_6$ under the conditions of a gas pressure of 5-10 mTorr and an RF bias power of 1000-2500 W. After the trimming process is completed, at step 250 of photoresist ash process, the photoresist layer 18 is stripped from the semiconductor substrate 10, and the via 20" has a rounded corner 24 as shown in FIG. 12 is produced. It may be optional to further clean any remaining residues that may exist on the substrate 10 using a wet cleaning process, involving either an acidic or basic solution.

The undercut trimming process performed after the via etching process can eliminate the silicon undercut profile, silicon bird's beak structure and scalloping pattern so as to smooth the via sidewall profile, round the top corner of the via, and improve the via sidewall coverage for subsequent depositing processes including the formation of a seed layer, a barrier layer and/or a passivation layer. This can benefit the via filling process and enhance the through-substrate via performance.

Figure 13:
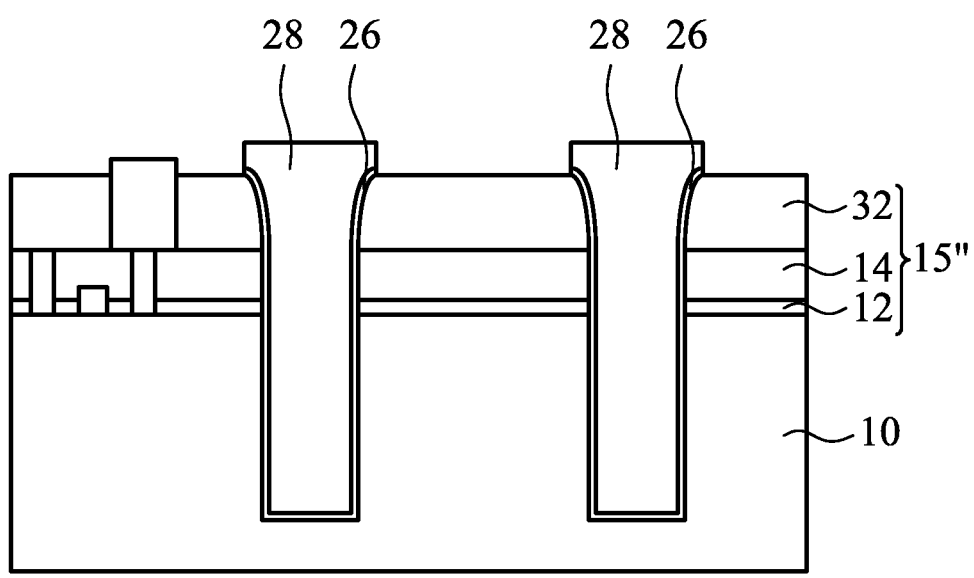

As shown in FIG. 13, the method proceeds to step 260 for processing of the through-substrate via 20". The through-substrate via 20" having a tapered profile and a rounded corner is then coated and/or filled with an insulating material 26 and/or a conductive material 28. The method may continue to further process steps such as chemical mechanical polish, wafer thinning, further metallization processes to provide interconnections, and/or other processes.

One aspect of the present disclosure relates to an integrated circuit structure. The integrated circuit structure includes a semiconductor substrate and a hard mask layer formed on the semiconductor substrate. The integrated circuit structure further includes at least a conductive layer formed in the hard mask layer and a via extending from the hard mask layer to at least a portion of the semiconductor substrate, wherein the via has a round corner and a tapered sidewall.

Another aspect of the present disclosure relates to an integrated circuit structure. The integrated circuit includes a semiconductor substrate and a hard mask layer formed on the semiconductor substrate. The integrated circuit structure further includes a via extending from the hard mask layer to at least a portion of the semiconductor substrate, wherein the via has a round corner and a tapered sidewall. The integrated circuit structure further includes a conductive material disposed in the via and an insulating material between sidewalls of the conductive material and sidewalls of the via.

Still another aspect of the current disclosure relates to an integrated circuit structure. The integrated circuit structure includes a semiconductor substrate and a hard mask layer formed on the semiconductor substrate. The integrated circuit structure further includes a conductive contact extending from the hard mask layer to at least a portion of the semiconductor substrate, wherein the conductive contact has a round corner and a tapered sidewall. The integrated circuit structure further includes an insulating material between sidewalls of the conductive contact and the semiconductor substrate.

In the preceding detailed description, the present disclosure is described with reference to specifically exemplary embodiments thereof. It will, however, be evident that various modifications, structures, processes, and changes may be made thereto without departing from the broader spirit and scope of the present disclosure, as set forth in the claims. The specification and drawings are, accordingly, to be regarded as illustrative and not restrictive. It is understood that the present disclosure is capable of using various other combinations and environments and is capable of changes or modifications within the scope of the inventive concept as expressed herein.

What is claimed is:

1. An integrated circuit structure, comprising:
   a semiconductor substrate;
   a hard mask layer formed on the semiconductor substrate;
   at least a conductive layer formed in the hard mask layer; and
   a via extending from the hard mask layer to at least a portion of the semiconductor substrate, wherein the via has a round corner and a tapered sidewall.

2. The integrated circuit structure of claim 1, wherein the hard mask layer comprises:
   an etch stop layer formed on the semiconductor substrate; and
   a first dielectric layer formed on the etch stop layer, wherein the conductive layer formed in the hard mask layer is a contact structure.

3. The integrated circuit structure of claim 2, wherein the etch stop layer comprises silicon nitride.

4. The integrated circuit structure of claim 1, wherein the hard mask layer comprises:
   an etch stop layer formed on the semiconductor substrate;
   a first dielectric layer formed on the etch stop layer; and
   a second dielectric layer formed on the first dielectric layer, wherein the conductive layer formed in the hard mask layer is an interconnect structure.

5. The integrated circuit structure of claim 1, wherein the via is filled with a conductive material.

6. The integrated circuit structure of claim 5, wherein the conductive material is copper.

7. The integrated circuit structure of claim 5, wherein the conductive material protrudes beyond the hard mask layer opposite the semiconductor substrate.

8. The integrated circuit structure of claim 5, further comprising an insulating material between sidewalls of the conductive material and sidewalls of the via.

9. The integrated circuit structure of claim 8, wherein a portion of the sidewalls of the conductive material are exposed by the insulating material.

10. The integrated circuit structure of claim 1, further comprising an inter-metal dielectric over the hard mask layer.

11. An integrated circuit structure, comprising:
    a semiconductor substrate;
    a hard mask layer formed on the semiconductor substrate;
    a via extending from the hard mask layer to at least a portion of the semiconductor substrate, wherein the via has a round corner and a tapered sidewall;
    a conductive material disposed in the via; and
    an insulating material between sidewalls of the conductive material and sidewalls of the via.

12. The integrated circuit structure of claim 11, wherein the insulating material is between a bottom of the via and the conductive material.

13. The integrated circuit structure of claim 12, wherein a portion of the sidewalls of the conductive material are exposed by the insulating material.

14. The integrated circuit structure of claim 12, wherein an entirety of the sidewalls of the conductive material are covered by the conductive material.

15. The integrated circuit of claim 12, further comprising a device formed in the hard mask layer.

16. The integrated circuit of claim 15, further comprising an interconnect structure formed in the hard mask layer.

17. An integrated circuit structure, comprising:
    a semiconductor substrate;
    a hard mask layer formed on the semiconductor substrate;
    a conductive contact extending from the hard mask layer to at least a portion of the semiconductor substrate, wherein the conductive contact has a round corner and a tapered sidewall; and
    an insulating material between sidewalls of the conductive contact and the semiconductor substrate.

18. The integrated circuit structure of claim 17, wherein the hard mask layer comprises
    a contact etch stop layer on the semiconductor substrate; and
    an inter-level dielectric on the contact etch stop layer.

19. The integrated circuit structure of claim 17, further comprising an adhesion promoting layer between the conductive contact and the insulating layer.

20. The integrated circuit structure of claim 17, wherein a top portion of the conductive contact is free of the insulating layer.

* * * * *